(12) United States Patent
Freeman et al.

(10) Patent No.: US 7,180,157 B2
(45) Date of Patent: Feb. 20, 2007

(54) BIPOLAR TRANSISTOR WITH A VERY NARROW EMITTER FEATURE

(75) Inventors: Gregory G. Freeman, Hopewell Junction, NY (US); Marwan H. Khater, Poughkeepsie, NY (US); Francois Pagette, Fishkill, NY (US); Andreas D. Stricker, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 10/978,775

(22) Filed: Nov. 1, 2004

(65) Prior Publication Data

US 2005/0082642 A1    Apr. 21, 2005

Related U.S. Application Data

(62) Division of application No. 10/249,780, filed on May 7, 2003, now Pat. No. 6,858,485.

(51) Int. Cl.
    *H01L 27/082* (2006.01)
(52) U.S. Cl. ............................. 257/565; 257/E29.03
(58) Field of Classification Search ................ 257/565, 257/579, E29.03
    See application file for complete search history.

(56) References Cited

U.S. PATENT DOCUMENTS 5,866,462 A    2/1999    Tsai et al. ................... 438/366
6,380,017 B1   4/2002    Darwish et al. ............. 438/202
6,440,810 B1   8/2002    Johansson et al. .......... 438/309
6,475,848 B1   11/2002   Darwish et al. ............. 438/202

OTHER PUBLICATIONS

Greg Freeman et al., "SiGe HBT Performance and Reliability Trends through $f_t$ of 350 GHz", Proc. IEEE Reliability Physics Symposium (Mar. 30, 2003).
Mathia Rickelt et al., "Influence of Impact-Ionization Induced Instabilities on the Maximum Usable Output Voltage of Si-Bipolar Transistors", IEEE Trans. on Electron Devices vol. 48 n.4 p. 774-783 (Apr. 2001).

*Primary Examiner*—Lex H. Malsawma
(74) *Attorney, Agent, or Firm*—Graham S. Jones, II; H. Daniel Schnurmann (57) ABSTRACT

A double-polysilicon, self-aligned bipolar transistor has a collector region formed in a doped semiconductor substrate, an intrinsic counterdoped base formed on the surface of the substrate and a doped intrinsic emitter formed in the surface of the intrinsic base. An etch stop insulator layer overlies the intrinsic base layer above the collector. A base contact layer of a conductive material overlies the etch stop dielectric layer and the intrinsic base layer. A dielectric layer overlies the base contact layer. A wide window extends through the insulator layer and the base contact layer down to the insulator layer. An island or a peninsula is formed in the wide window leaving at least one narrowed window within the wide window, with sidewall spacers in either the wide window or the narrowed window. The narrowed windows are filled with doped polysilicon forming an extrinsic emitter with the intrinsic emitter formed below the extrinsic emitter in the surface of the intrinsic base.

20 Claims, 10 Drawing Sheets

BIPOLAR TRANSISTOR WITH A VERY NARROW EMITTER FEATURE

This application is a divisional of U.S. application Ser. No. 10/249,890, filed on May 7, 2003, now U.S. Pat. No. 6,858,485.

BACKGROUND OF INVENTION

This invention relates to semiconductor transistors and more particularly to a method of manufacture of bipolar transistors with enhanced emitter structures.

In the manufacture of bipolar transistors the trend in the semiconductor industry is to increase the switching speed performance of such transistors. To achieve enhanced switching speed performance, the layers through which the electrons traverse in the bipolar transistors must continually be decreased. Principally, these dimensions are the neutral base dimension and the collector-base space-charge dimension. Scaling the device also involves increasing the collector dopant concentration, which has the aforementioned effect of reducing the collector-base, space-charge dimension. In addition, scaling the device increases the current density at which the device reaches its peak operating speed.

Besides the positive effect of enhancing the switching speed of the device, there are problems in that the changes in the collector of the bipolar transistor have some potentially negative side-effects. One such problem is the increase of avalanche multiplication from the increased electric field in the collector-base space-charge region. A second problem is the increase of self-heating of the device. Such effects are described in more detail in G. Freeman, J.-S. Rieh, B. Jagannathan, Z. Yang, F. Guarin, A. Joseph, D. Ahigren, "SiGe HBT Performance and Reliability Trends through $f_T$ of 350 GHz," Proc. IEEE Reliability Physics Symposium (Mar. 30, 2003). (hereinafter referred to as Freeman 2003) and M. Rickelt, H. M. Rein and, E. Rose, "Influence of Impact-Ionization Induced Instabilities on the Maximum Usable Output Voltage of Si-Bipolar Transistors," IEEE Trans. on Electron Devices Vol. 48 n.4 p. 774–783 (April 2001) (hereinafter referred to as Rickelt 2001) One solution to the problem of the increasing self-heating of the device is to spread the current and thus the power over a larger region of the device, which reduces the thermal resistance and reduces the temperature rise of the device. Typically, as the current density of the device is increased due to the increased collector concentration, the width of the lithographically-defined emitter is reduced inversely with the current density increase, resulting in a similar current per unit length of the device.

Also, the increasing avalanche current must be accommodated in device design. In particular, as avalanche current increases with device scaling, side-effects, such as pinch-in phenomena, become predominant that limit the maximum attainable voltage in a device. The device design needs to be modified to accommodate this effect and to offer a design option that attains the highest possible voltage output capability.

In pinch-in, the device current is focused into the center of the device, where very high power densities can cause problems in device operation. The pinch-in effect is described well in Rickelt 2001.

Figure 1A:
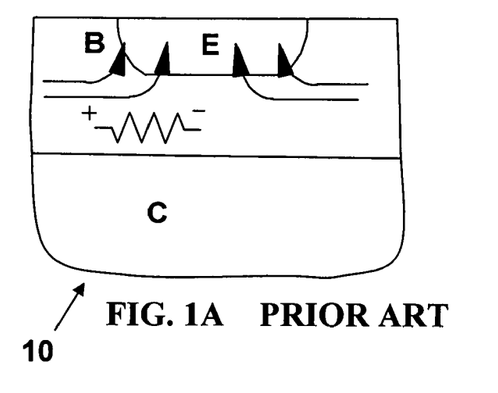
FIGS. 1A–1C illustrate several aspects in the prior art of the phenomenon of side effects such as pinch-in as avalanche current increases.
Figure 1B:
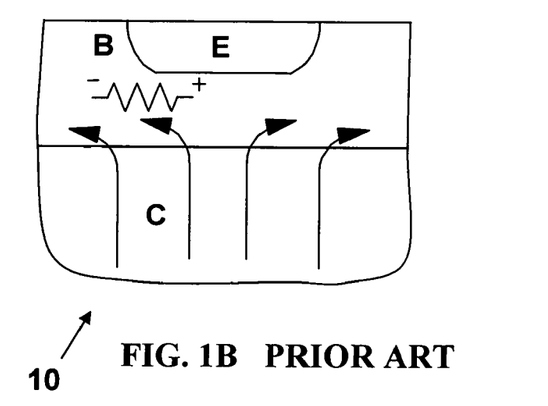
Figure 1C:
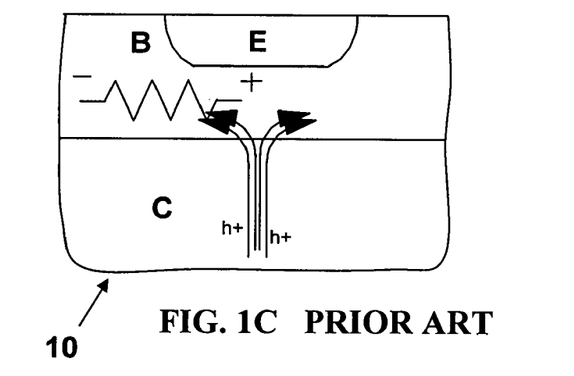

FIGS. 1A–1C illustrate several aspects in the prior art of the phenomenon of side effects such as pinch-in as avalanche current increases.

FIG. 1A illustrates operation of a prior art bipolar device 10 with the collector C on the bottom, below the intrinsic base B, and with the emitter E formed in the top surface of the intrinsic base B. The device 10 is in the low collector voltage state, wherein avalanche does not occur, and the base current flows from the base B into the emitter E of the device 10. FIG. 1B illustrates the prior art device 10 of FIG. 1A in the moderate avalanche condition, wherein the base current flows relatively uniformly up from the collector C through the intrinsic base B and out of the base terminal of the device 10. FIG. 1C illustrates the device 10 of FIG. 1A under the strong avalanche condition, wherein the exiting base current creates a distribution of internal base-emitter voltage, such that the center of the device is turned on more strongly than the external portion of the collector C of the device 10 whereby the current lines in the drawing are absent from the external portion of collector C. This latter condition is the undesirable pinch-in condition.

Thus there is a need to further enable scaling of such devices to deliver higher performance through providing a device design that counters the trends towards the problem of the avalanche effect and the problem of self-heating. To counter the kind of avalanche effect described above, in the past it has been suggested that the base resistance may be further reduced to compensate for the increased avalanche (Freeman 2002). However, the problem is that methods or structures, which enhance the voltage capability have not been described.

Figure 2:
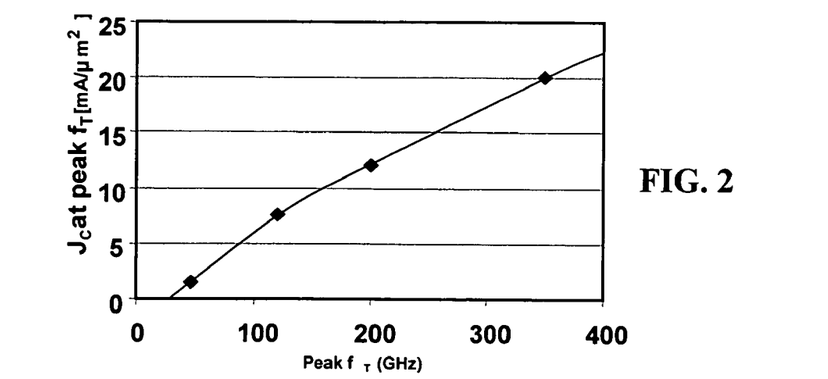
FIG. 2 is a graph showing an empirical trend in the prior art of the current density versus the device design peak fT.

To accommodate the current density increase, a reduction in the stripe width continues to be a goal. Yet very narrow dimensions are increasingly difficult to attain. FIG. 2 is a graph showing an empirical trend in the prior art of current density versus device design peak fT. The graph of FIG. 2 illustrates the increase in current density by generation (Freeman 2002). Note for instance that transitioning from the 200 GHz device design to the 350 GHz device design results in a current density increase from 12 mA/$\mu$m$^2$ to 20 mA/$\mu$m$^2$. Considering that the device dimension for a 200 GHz device is 0.12 $\mu$m, a straightforward scaling of the emitter width would result in an emitter dimension of 0.072 $\mu$m. Due to perimeter injection from the emitter, we find that the current does not scale directly with emitter width, resulting in the desire to scale the dimension to yet smaller dimensions. Thus it is desirable to provide as small an emitter dimension as is possible. Small dimensions may be obtained through advanced lithography techniques. Yet such techniques are costly and involve constraints such as pattern density, minimum dimensions, and mask data preparation complexities.

U.S. Pat. No. 5,866,462 of Tsai et al. entitled "Double-Spacer Technique for Forming a Bipolar Transistor with a Very Narrow Emitter" describes a larger lithography method for defining a smaller dimension emitter. The Tsai et al. technique involves starting with a substrate on which a layer of base-contact polysilicon and a layer of dielectric film (a Low Temperature Oxide (LTO)) thereabove. First, an opening is established in the LTO dielectric film. Next, a narrower opening is defined by creating a first set of dielectric sidewall spacers on the walls of that opening. Then an emitter opening is etched through the base-contact polysilicon. Next a second set of dielectric sidewall spacers are formed inside the emitter opening defining a narrowed emitter opening. Then, polysilicon is applied through the narrowed emitter opening to contact the emitter region in the substrate. The resultant narrowed opening has the dimension of the original opening less twice the sidewall spacer dimension. Such a resultant dimension may not be made so small that the variation in size of the original opening together with the variation in size of the sidewall spacer may subtract substantially from the expected size, thus rendering the device not useful. Thus there is an issue with process control and with minimum dimensions achievable with the structure described by Tsai et al. Furthermore, the large width to height aspect ratio would likely result in a significant emitter resistance, which is detrimental to device performance.

U.S. Pat. No. 6,380,017 of Darwish et al. entitled "Polysilicon-Edge, Base-Emitter Super Self-Aligned, Low Power, High Frequency Bipolar Transistor and Method of Forming the Transistor" describes an alternate approach is to use a sidewall spacer to define the emitter dimension. Yet the approach provided by Darwish et al. does not provide for an emitter contact over the emitter region, which is needed to maintain a low emitter resistance for high performance bipolar transistor operation.

SUMMARY OF INVENTION

This invention provides a structure including an emitter, the dimension of which is defined by a conformal layer and thus may be made very small and with a controllable dimension. The metal contact may be made in close proximity to the device which will establish a low emitter resistance required for high performance device operation. Further, a donut emitter may be formed that does not contain an emitter junction in the center of the device, and thus would not be sensitive to the pinch-in effect of the device operation, and thus could sustain higher voltages. Moreover, this invention addresses the above-described problems of high-performance NPN transistors, i.e., pinch-in from avalanche and increased self-heating, by providing a method for creating an extremely narrow emitter, which in addition to the conformal layer utilizes sidewall spacers to define the emitter width.

In accordance with this invention, a a double-polysilicon, self-aligned bipolar transistor has a collector region formed in a doped semiconductor substrate, an intrinsic counterdoped base formed on the surface of the substrate and a doped emitter formed in the surface of the intrinsic base. An etch stop dielectric layer is formed over the intrinsic base layer above the collector. A base contact layer of a conductive material is formed over the etch stop dielectric layer and the intrinsic base layer. A second dielectric layer is formed over the base contact layer. A wide window is formed extending through the dielectric layer and the base contact layer stopping at the etch stop dielectric layer. A conformal layer is formed in the wide window. An island or a peninsula is formed from the conformal layer, thereby narrowing the wide window leaving at least one narrowed window within the wide window. Sidewall spacers are formed in the narrowed window(s). The narrowed window(s) is (are) filled with doped polysilicon to form an extrinsic emitter(s). An emitter is formed below the extrinsic emitter(s) in the surface of the intrinsic base.

Preferably dual narrowed windows are formed separated by the narrowing structure which comprises an island formed on the etch stop layer between the dual narrowed windows with dual extrinsic emitters juxtaposed with the island. Preferably, the single extrinsic emitter region forms a moat such as an annulus/donut surrounding the dielectric island which defines the central region of the annulus/donut shape.

Alternatively, the annulus/donut comprises a polygonal or irregular ring about the central dielectric island.

In another aspect of this invention, a double-polysilicon, self-aligned bipolar transistor having a collector region that is formed in a doped semiconductor substrate, with an intrinsic counterdoped base formed on the surface of the substrate and a doped emitter formed in the surface of the intrinsic base. An etch stop dielectric layer is formed over the top surface of the intrinsic base layer above the collector region in the substrate. A base contact layer of a conductive material is formed over the etch stop dielectric layer and the intrinsic base layers. A second dielectric layer is formed over the base contact layer. A wide window extends through the dielectric layer and the base contact layer stopping the etching of the window at the etch stop dielectric layers. There are sidewall spacers formed on the sides of the wide windows. There is a narrowing structure formed in the wide window leaving the narrowing structure juxtaposed with at least one narrowed window within the wide window. The narrowed window and the remainder of the wide window are filled with doped polysilicon comprising an extrinsic emitter; and an emitter is formed below the extrinsic emitter in the surface of the intrinsic base.

Preferably, a single asymmetric narrowed window is formed by the narrowing structure which comprises a peninsula formed on the etch stop layer juxtaposed with the extrinsic emitter.

In another aspect of this invention, a double-polysilicon, self-aligned bipolar transistor having a collector region formed in a doped semiconductor substrate, an intrinsic counterdoped base formed on the surface of the substrate and a doped emitter formed in the surface of the intrinsic base, comprises: an etch stop dielectric layer over the top surface of the intrinsic base layer above the collector region in the substrate; a base contact layer of a conductive material over the etch stop dielectric layer and the intrinsic base layer; second dielectric layer over the base contact layer; a wide window extending through the dielectric layer and the base contact layer stopping the etching of the window at the etch stop dielectric layer; sidewall spacers on the sides of the wide window; a narrowing structure in the wide window leaving the narrowing structure juxtaposed with at least one narrowed window within the wide window; the narrowed window and the remainder of the wide window filled with doped polysilicon comprising an extrinsic emitter; and an emitter below the extrinsic emitter in the surface of the intrinsic base.

Preferably dual extrinsic emitters are juxtaposed with a central island between the sidewall spacers.

BRIEF DESCRIPTION OF DRAWINGS

The foregoing and other aspects and advantages of this invention are explained and described below with reference to the accompanying drawings, in which.

DETAILED DESCRIPTION

Figure 3:
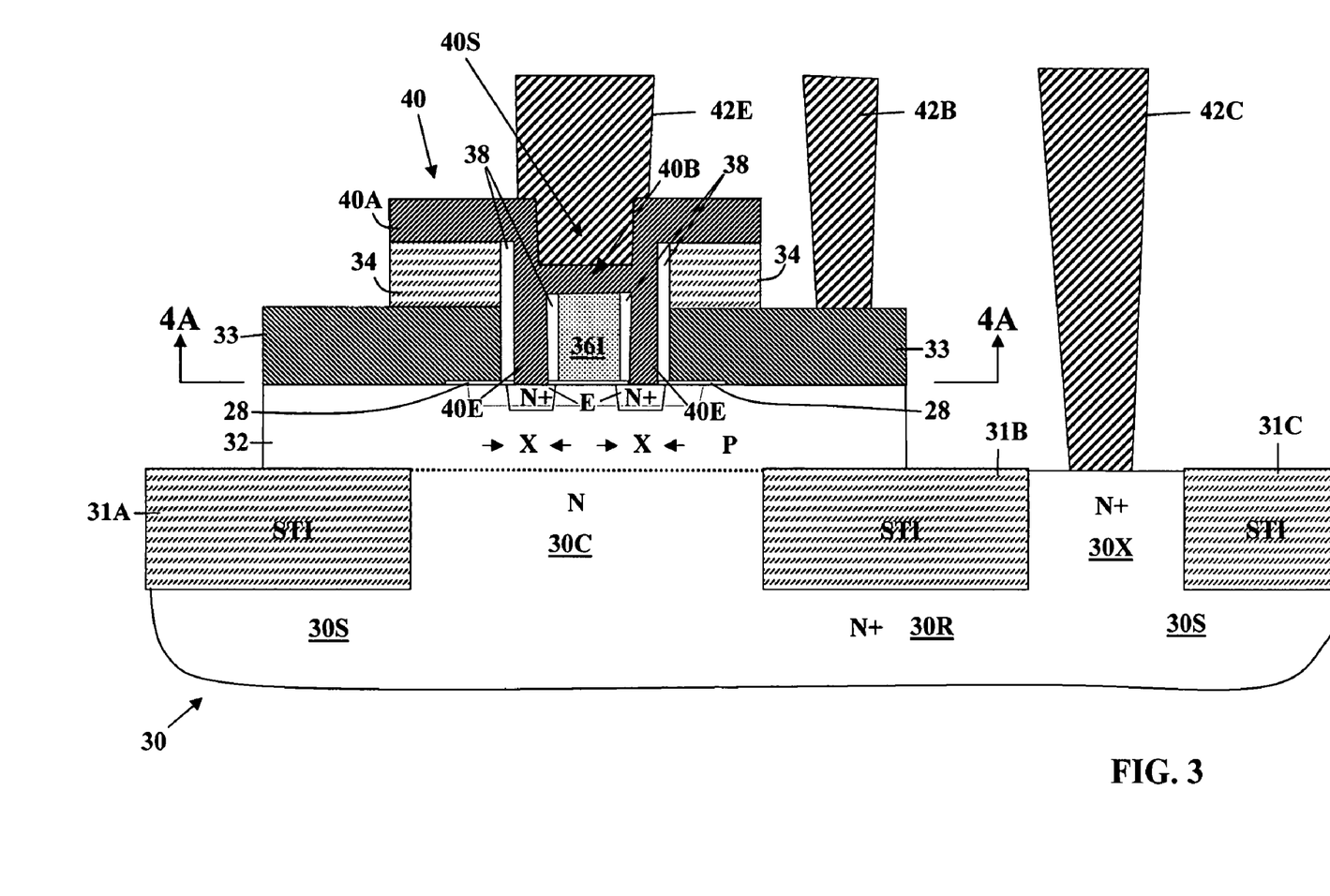
FIG. 3 shows a bipolar transistor with a dual emitter, symmetric structure in accordance with this invention with an intrinsic base in which symmetrically arranged dual emitter regions are formed connected to dual extrinsic emitter connectors on either side of a dielectric island and an etch stop layer.

FIG. 3 shows a bipolar transistor 30 comprising a silicon semiconductor substrate 30S, which is doped with N type dopant, in which a collector region 30C is formed and on the top surface of which an intrinsic base 32 is formed. A patterned etch stop/first and is formed above the top surface of centered over the intrinsic base 32 and the collector region 30C. A base contact layer 33 and second dielectric layer 34 are stacked above the intrinsic base 32 and the periphery of the first dielectric film 28, with a wide central window (35 in FIG. 4A) therethrough extending down to the too surface of the dielectric film 28. A dielectric island 36I is centered in the central window over the first dielectric film 28 with sidewall spacers 38 juxtaposed with the dielectric island 36I and the sidewalls of the wide central window (35 in FIG. 4A) formed through the base contact layer 33 and second dielectric layer 34. An extrinsic emitter 40 including extrinsic emitter region 40E and portions 40B and 40A fills the window between the spacers 38 and the above the island 36I. In the top surface of the intrinsic base 32 dual intrinsic emitter regions E are centered above the collector region 30C below the first dielectric film 28 and the dielectric island 36I on either side thereof. The dual intrinsic emitter regions E are connected to dual extrinsic emitter connectors 40E on either side of the dielectric island 36I and extend through a portion of a patterned etch stop/insulator film 28. A plurality of Shallow Trench Isolation (STI) regions 31A, 31B and 31C are formed spaced apart in the surface of the substrate 30S. The collector region 30C is formed between two leftmost ones of the STI regions 31A and 31B in the substrate 30S. The intrinsic base 32 (base layer B) of the bipolar transistor 30 is formed on top of the left portion of the substrate 30S, bridging across the collector region 30C and most of the two leftmost STI regions 31A and 31B, leaving margins thereof not covered by the intrinsic base 32.

The dual extrinsic emitter regions E are formed in the top surface of the intrinsic base 32 centered directly above the collector region 30C. The collector region 30C is centered directly below the bottom surface of the intrinsic base region 32. Aside from the intrinsic base 32, to the right thereof, the collector contact region 30X is formed in the substrate 30S between the rightmost STI regions 31B and 31C. A buried N+ doped contact region 30R extends across through the substrate 30S beneath the STI region 31B, well below the top surface of the substrate 30S, to provide electrical connection between the collector region 30C and the contact region 30X. The contact region 30X reaches from the buried, doped contact region 30R to the top surface of the substrate 30S, where it contacts the collector contact 42C which rests on the top surface of the contact region 30X, between the STI regions 31B and 31C.

A patterned thin etch stop/insulator film 28 composed of silicon dioxide bridges across the top surface of most of the central portion of the intrinsic base 32 above the collector region 30C except where a dual pair of N+ doped extrinsic emitters 40E extend down therethrough to contact the top surface of the dual intrinsic emitter regions E formed centrally in the top surface of the intrinsic base 32.

An extrinsic base/contact layer 33 preferably comprising a first doped polysilicon layer is formed on the top surface of the intrinsic base 32 and covering the top surface of the etch stop/insulator film 28. A narrower, second insulating layer 34 preferably composed of silicon dioxide is formed centrally above the extrinsic base/contact layer 33. A central opening 35 (shown in FIG. 4A) has been etched through the second insulating layer 34 and the extrinsic base/contact layer 33 down to the top surface of the etch stop/insulator film 28 providing space for the dielectric island 36I. Outer dielectric sidewall spacers 38 are formed on the sidewalls of the central opening 35.

The dual pair of N+ doped intrinsic emitter regions E, which are formed in the central portion of the surface of the intrinsic base 32, are separated by the width of a dielectric island 36I, preferably composed of silicon nitride and a set of inner sidewall spacers 38 on the outer sidewalls of the dielectric island 36I. The dielectric island 36I and the inner spacers 38 are formed on the top central surface of the etch stop/insulator film 28.

A single extrinsic emitter region 40E forms a moat such as an annulus/donut (above the intrinsic emitter region E) surrounding the dielectric island 36I which defines the central region of the annulus/donut shape, and extending through the etch stop/insulator film 28 into direct contact with the N+ doped intrinsic emitter regions E.

A modification of the annulus/donut can comprise a polygonal or irregular ring 40E about the central dielectric island 36I.

A blanket layer of extrinsic emitter 40, preferably composed of a second deposit of doped polysilicon, fills most of the central opening defined by the sidewall spacers 38 and the top of dielectric island 36I with the blanket layer of extrinsic emitter 40 including extrinsic emitter region 40E and portions 40B and 40A. The extrinsic emitter 40 forms a conformal layer over the second insulating layer, providing a hollow space 40S to which the lower end of an emitter contact 42E is bonded. A base contact 42B is shown bonded to the top surface of the base contact layer 33. A collector contact 42C is shown bonded to the top surface of the collector contact region 30X which is formed between the STI regions 31B and 31C of the substrate 30S.

Emitter resistance is kept low through the ability to place the metal emitter contact 42E in close proximity to the emitter base junction. The resultant structure, as illustrated in FIG. 3, has the benefit that the emitter is split into the two emitter regions E formed in the central portion of the surface of the intrinsic base 32 (in the 2-dimensional sectional view shown, or an annulus/donut E from the top-down view of the device). Each of the emitter regions E has sub-lithographic dimensions, which results from a substantially larger feature size, which may be easily derived from use of inexpensive lithographic steps. The effective emitter stripe width of a pair of dual extrinsic emitter regions E is the total of the two dimensions of the dual emitter regions E, each signified X in the FIG. 3A such that the total is equivalent to the dimension 2X.

Figure 5:
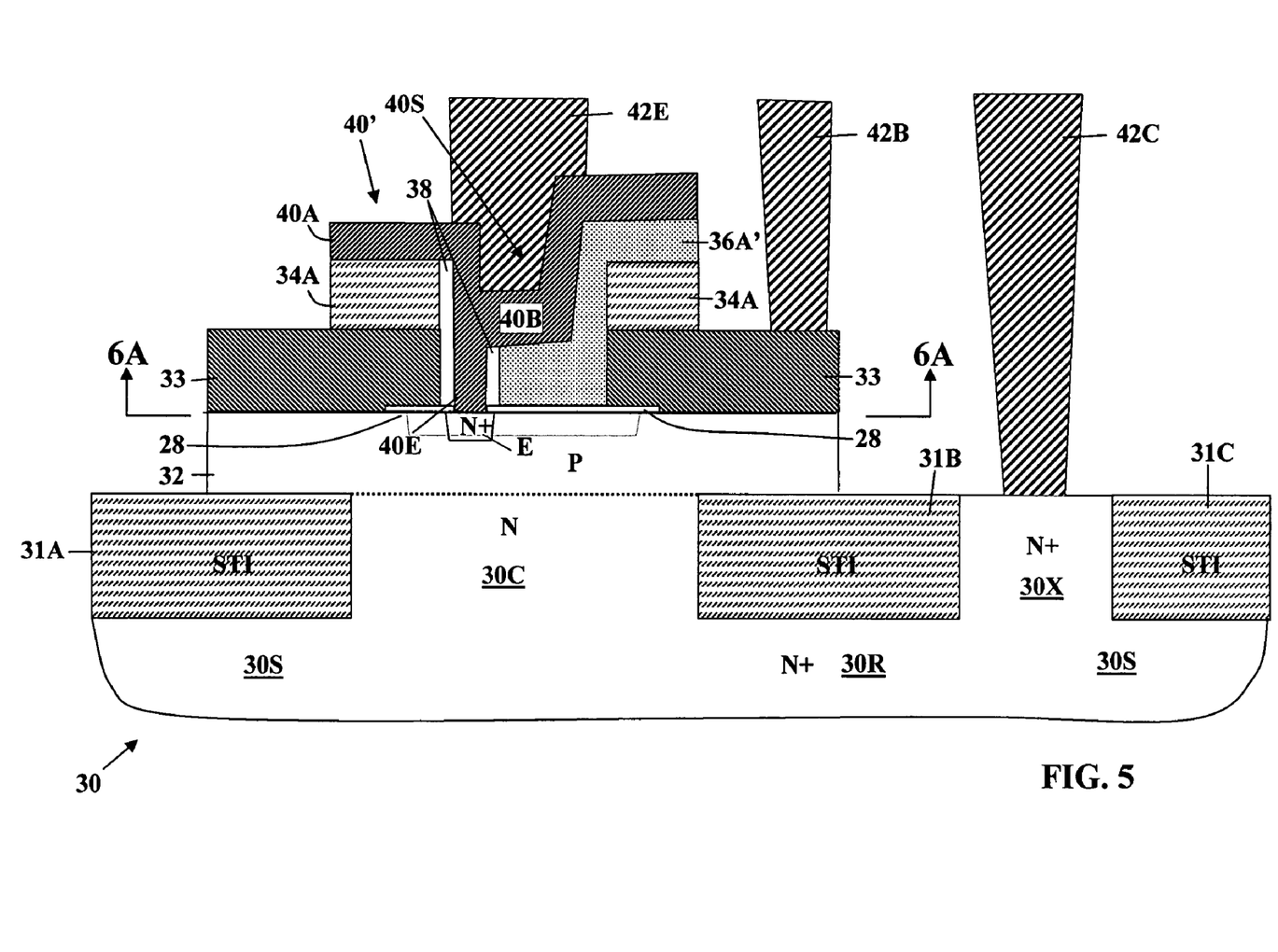
FIG. 5 shows a single emitter comprising an asymmetric structure in accordance with this invention which is a modification of the dual emitter structure of FIG. 3.
Figure 6A:
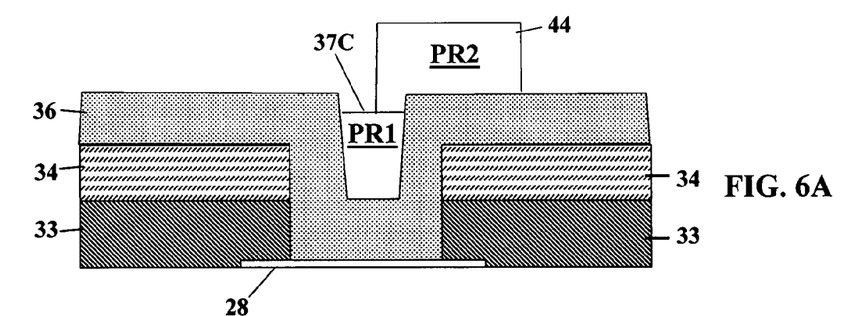
FIGS. 6A–6C show the processing steps in accordance with this invention employed to form the device of FIG. 5, including portions thereof above line 4A—4A in FIG. 5.
Figure 6B:
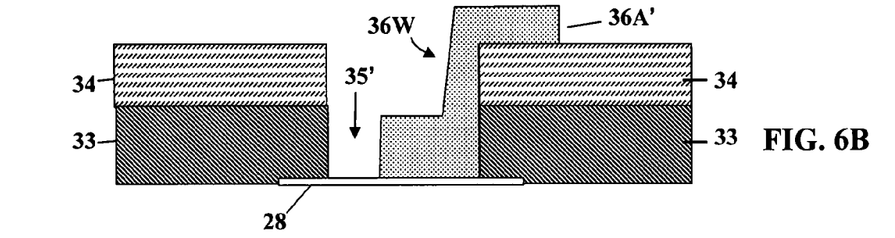
Figure 6C:
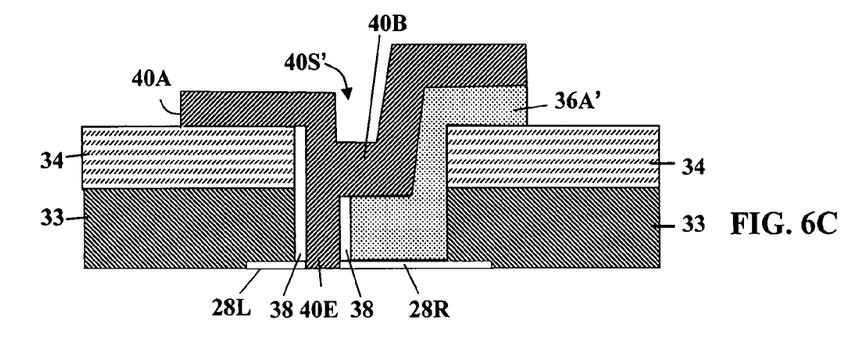

Further referring to FIG. 5, as shown in FIG. 6A, an additional PR2 mask 44 is used that eliminates the opening of a dual intrinsic emitter region E as shown in FIG. 3, resulting in the single-sided extrinsic emitter region 40E and single intrinsic emitter region E, as shown in FIGS. 5 and 6C. As in the case of the structure of FIG. 3, with or without the additional PR2 mask 44 of FIGS. 6A and 6B, this invention provides an improvement over a single wide emitter in that the emitter area is reduced and thus the current and power dissipation is reduced. With the additional mask, the emitter area is further reduced, resulting in a further reduced current and power dissipation. In FIG. 5, the dielectric island 36I of FIG. 3 has been replaced by a dielectric peninsula 36A' shown in FIGS. 6B and 6C, which blocks off one side of the central opening leaving the left emitter window 35' (shown in FIG. 6B)

Figure 7:
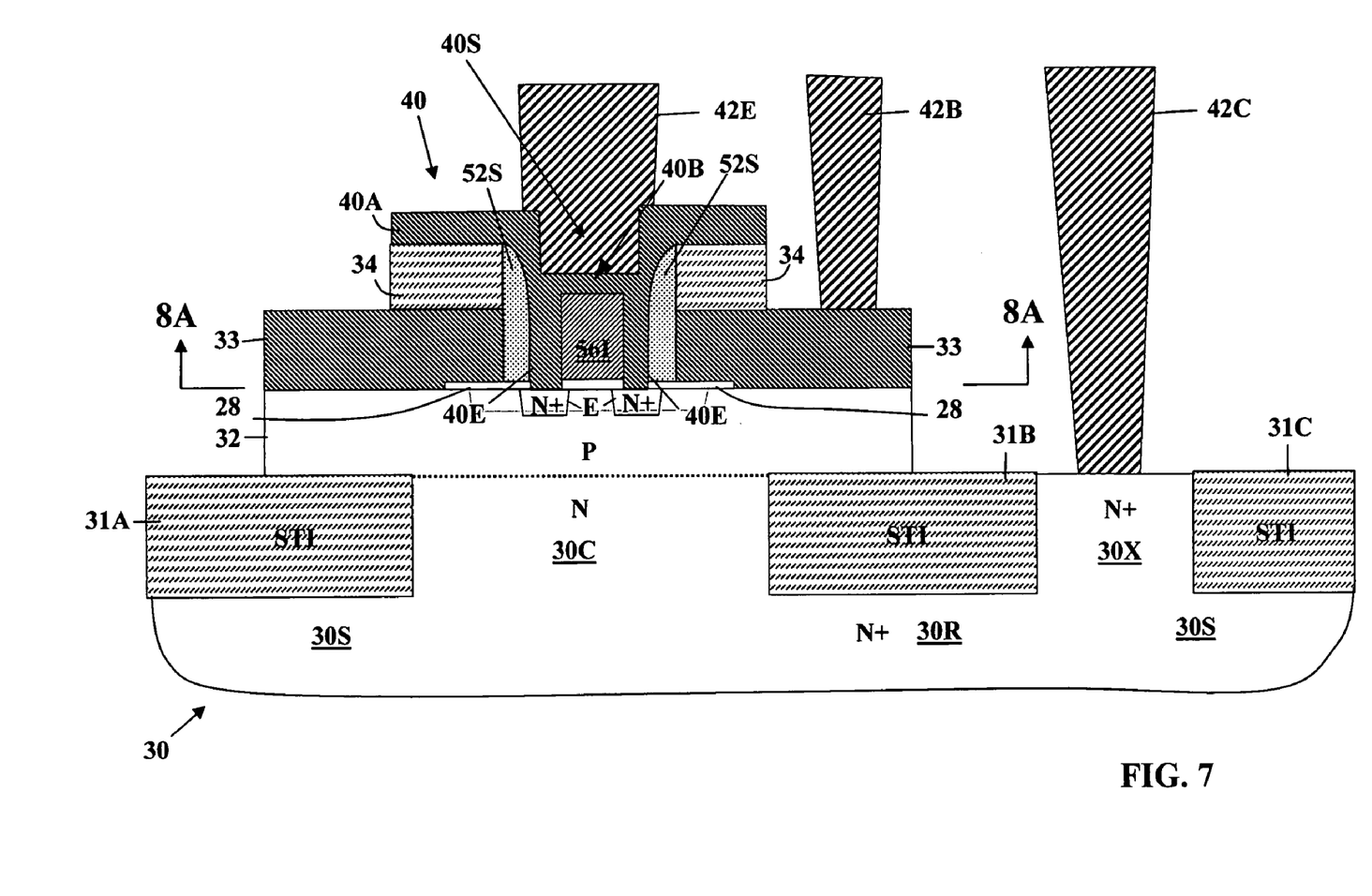
FIG. 7 shows a dual emitter, symmetric structure in accordance with this invention which is a modification of the structure of FIG. 3 where replacing the dielectric with polysilicon further reduces the emitter resistance since the current will traverse through an island of a conductive material (i.e. polysilicon) to reach the emitter contact.

FIG. 7 shows an alternative embodiment of FIG. 3, wherein the dielectric island 36I has been replaced by a polysilicon island 55, that is either doped or undoped.

Method

The method of this invention begins with the intrinsic base portion of the bipolar transistor (the base layer) on top of a substrate. This base layer contains the intrinsic portion of the base dopant which has been deposited through an epitaxy process or will later contain the base film defined through an implant. If the base dopant has been already formed through an epitaxy process, the depth of the dopant may be in the range of 10 nm to 50 nm from the surface. Prior process steps have formed as required trench isolation, subcollector, and collector implants, and other devices in the substrate by methods well known to those knowledgeable in the art. A layer of films is deposited on the base layer, where the top layer is an insulator film, and on the bottom is an etch-stop insulator film.

The process of forming the embodiment of the device 30 of FIG. 3 is shown in FIGS. 4A–4F which include the portions of FIG. 3 taken along line 4A—4A.

Figure 4A:
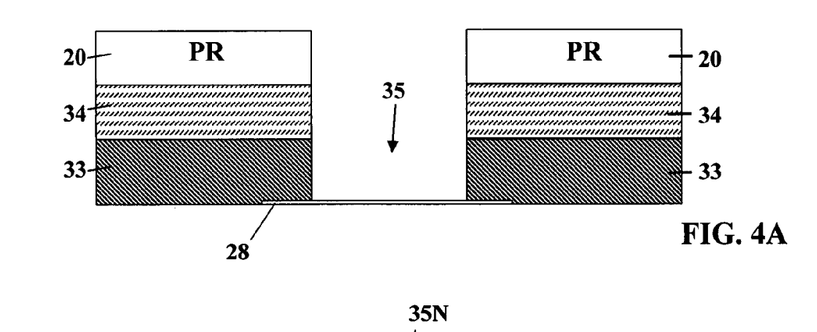
FIGS. 4A–4F show a first set of process steps in accordance with this invention of forming the embodiment of the device of FIG. 3 including portions thereof above line 4A—4A in FIG. 3.

FIG. 4A is a sectional view as in FIG. 3 in which the thin etch stop/insulator film 28 composed of silicon dioxide ($SiO_2$) (5 nm to 20 nm thick) has been defined previously on a portion of the top of the intrinsic base 32 of FIG. 3 which is not shown for convenience of illustration. The thick, extrinsic base/contact layer 33 is formed over the intrinsic base 32 and the patterned etch stop/insulator film 28. Layer 33 is preferably composed of doped polysilicon (20 nm to 200 nm thick).

A similarly thick upper insulation film 34 composed of silicon dioxide $SiO_2$ (20 nm to 200 nm thick) has been formed over the thick base contact layer 33. The thick base contact layer 33, preferably composed of polysilicon forms the extrinsic base portion of the device. Using the photoresist (PR) mask 20 etching is performed to form a wide central window 35 through the topmost two films 34/33 down to the patterned etch stop film 28 in the form of the super-structure shown in FIG. 4A.

If an implanted base dopant is required, such an implant may be performed at this point. The implant would be a preferred boron atom dopant (for an n-p-n transistor) and to a depth of 10–50 nm into the silicon layer, with angle implants and energies chosen according to well-known methods.

Figure 4B:
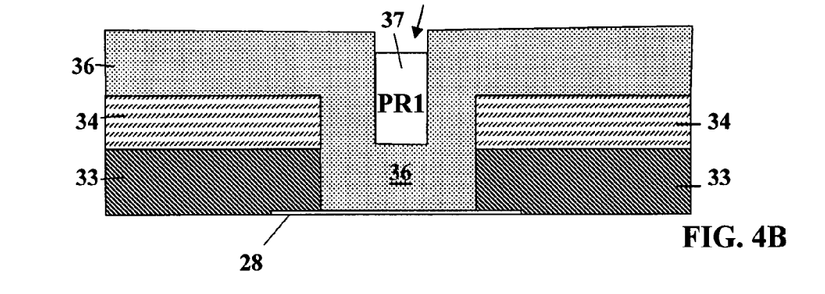

FIG. 4B shows the structure of FIG. 4A after depositing a blanket conformal, thin, dielectric film 36 of a composition which may be etched selective to the films 34/33 with horizontal exposed surfaces in the structure of FIG. 4A (preferably composed of silicon nitride in one embodiment) covering the exposed surface of the patterned etch stop film 28 and the thick upper insulation film 34. The conformal, thin, dielectric film 36 should be deposited to a sufficient thickness to define the emitter width (for extrinsic emitter region 40E as shown in FIG. 4F) as well as two sidewalls, and thus a thickness in the range of 100–300 nm is preferred, preferably less than half the width of the wide central window 35. As a result of deposition of the conformal dielectric film 36 into the wide central window 35, a depression 35N is formed above the wide central window 35, which is filled by a blanket deposit and etch-back of a photoresist film PR1. This results in a photoresist (PR1) emitter island plug 37 that is shown in FIG. 4B. Alternatively, other conformal dielectric films such as silicon dioxide ($SiO_2$) may be deposited and etched back or planarized via chemical-mechanical polish to obtain an emitter island PR1 plug 37, which is composed of a material other than photoresist.

Figure 4C:
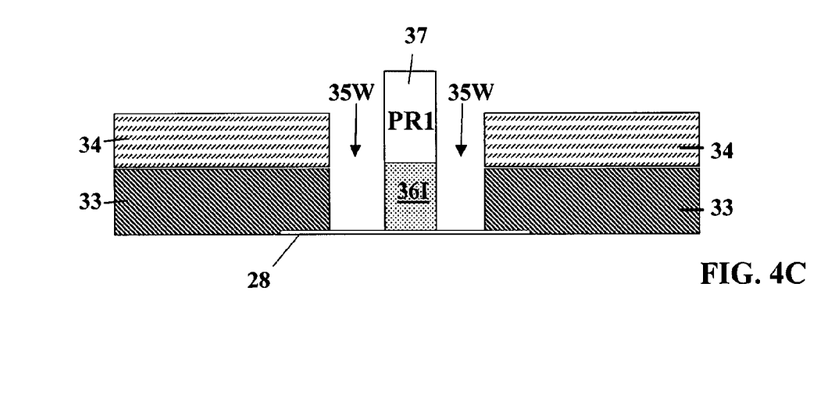

FIG. 4C shows the device of FIG. 4B after etching the conformal, thin, dielectric film 36 using the plug emitter island PR1 plug 37 as an etch mask. In this process, the conformal, thin, dielectric film 36, composed of silicon nitride or the like, is etched anisotropically, i.e. vertically. The upper insulation film 34 (i.e. the thick top $SiO_2$ film) and the etch stop/insulator film 28 (i.e. the thin bottom $SiO_2$ film) both provide etch-stops, such that aside from the plug 37 the conformal dielectric film 36 (silicon nitride) is removed anisotropically to form the dielectric island 36 as shown in FIG. 4C and the underlying intrinsic base layer 32 (FIG. 3) is not disturbed because of the protection afforded by the etch stop/insulator film 28. Thus a narrow extrinsic emitter window 35W is formed, the dimension of which is determined by the controllable sidewall dimension of film 36, and not by complex lithography processes.

At this point, an optional collector dopant (e.g. phosphorous for an n-p-n transistor) may be implanted through the emitter opening to a depth beyond the base dopant. Preferred energies are in the range 100 KeV to 250 KeV with doses in the range 1E12 to 2E13 atoms/$cm^3$.

Figure 4D:
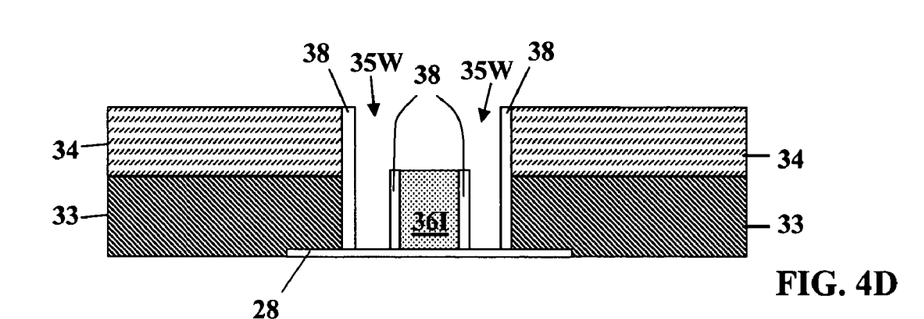

FIG. 4D shows the device of FIG. 4C after the removal of the photoresist plug 37 through standard techniques and after the structure has been modified by deposition and etching back of an insulator material (38) to form the set of insulating sidewall spacers 38 on the sidewalls of the window 37 and the dielectric island 36I. The result is that the wide central window 35 of FIG. 4A and window 35W of FIG. 4C has been modified into a narrower annular window 35W or a dual set of narrower juxtaposed extrinsic emitter windows 35W in FIG. 4D.

Preferably the insulating sidewall spacers 38 are composed of silicon nitride so that an end-point signal may be detected, but the insulating sidewall spacers 38 may be composed of silicon dioxide or any other suitable insulator. Dimensions are from 10–50 nm.

Figure 4E:
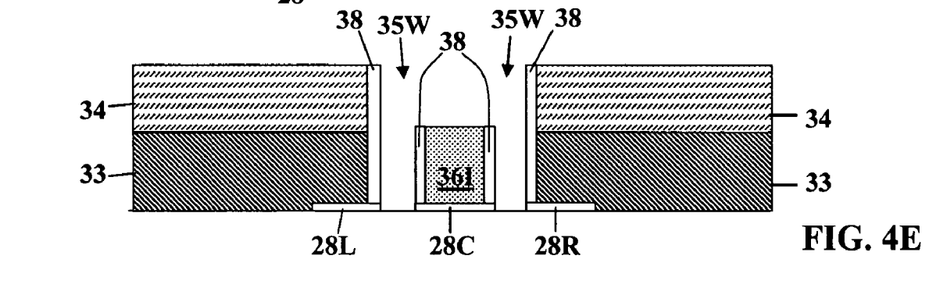
Figure 4F:
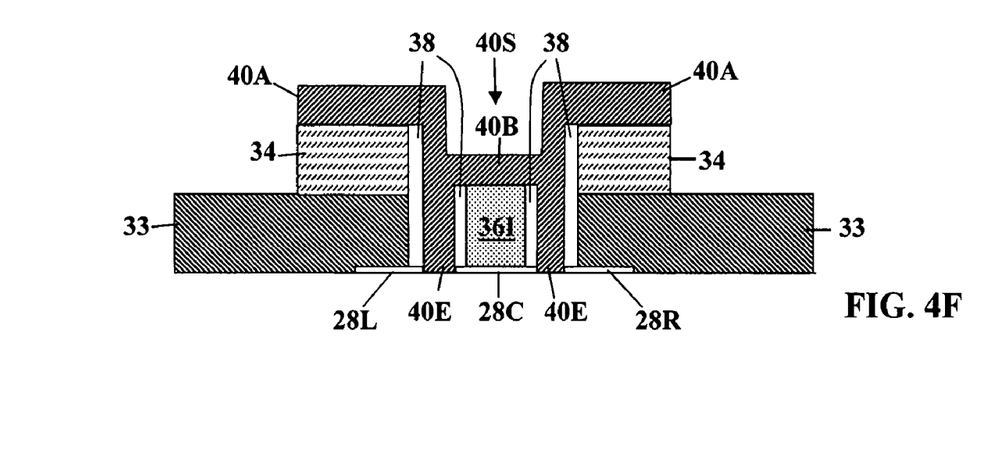

FIG. 4E shows the device of FIG. 4D after the exposed portions of the $SiO_2$ etch stop/insulator film 28 at the bottom of the narrowed extrinsic emitter window(s) 35W have been removed by an etch that is selective to the intrinsic base layer 32.

Then FIG. 4F shows the device of FIG. 4E after the extrinsic emitter film (40) composed of doped polysilicon is deposited and patterned, forming the dual extrinsic emitter connectors 40E on either side of the dielectric island 36I. This emitter polysilicon film (40) is preferred to be doped in-situ n-type (for an n-p-n transistor) or p-type (for a p-n-p transistor), so that the emitter dopant can extend evenly to the base film interface. As stated above, the extrinsic emitter film (40) comprises a conformal film coating the top surface of the second, upper, insulating layer 34, providing the hollow space 40S to which the lower end of an emitter contact 42E shown in FIG. 3 is to be bonded to the top of portion 40B of the extrinsic emitter film (40).

Then conventional process steps well known to those skilled in the art follow, e.g. patterning of the polysilicon of the extrinsic emitter 40 and patterning of the second, upper, insulating layer 34 both of which have been narrowed by conventional masking and etching back to provide access for the base contact 42B (FIG. 3) to be bonded to the top surface of the extrinsic base/base contact layer 33. Conventional processing steps well known to those skilled in the art are also employed for etching of layers 33 and 32 to pattern the extrinsic base/contact layer 33 and expose the collector region 30C. A high-temperature anneal is employed to drive in the dopant. Silicide, metal contacts and interconnects are formed resulting in the bipolar transistor 30 shown in FIG. 3.

In FIG. 5, the dual intrinsic emitter structure of FIG. 3 has been modified to form a single emitter E. Starting with the structure as shown in FIG. 4B, with the plug (37) formed of photoresist or silicon dioxide or another suitable material, a mask PR2, and a lithography processing step may be applied to cover one side of the structure, as shown in FIG. 6A The structure of FIG. 5 provides for a small and controllable emitter dimension, and a low aspect ratio emitter (with width and height similar to the conformal silicon nitride film deposited and thus an aspect ratio close to 1:1.

FIGS. 6A–6C show the processing steps employed to form the device 30 shown in FIG. 5 which is made by processing steps starting with the steps shown in FIGS. 4A and 4B.

Referring to FIG. 6A that illustrates early steps in the formation of device 30 of FIG. 5, as in FIG. 4A the thick second, upper insulation film 34, which is composed of silicon dioxide ($SiO_2$), with a thickness from about 20 nm to about 200 nm, has been formed over the base contact layer 33. The thick polysilicon layer 33 forms the extrinsic base portion of the device. Using the photoresist (PR) mask 20 of FIG. 4A, an emitter contact wide central window 35 (in FIG. 4A) was etched down through the topmost two films 34/33 down to the etch stop film 28 as in FIG. 4A. Then, as in FIG. 4B a deposit was made of a conformal, thin, dielectric film 36 of a composition which may be etched selective to the films 34/33 with horizontal exposed surfaces as in the structure of FIG. 4A (preferably composed of silicon nitride in one embodiment). As in FIG. 4B, as a result of deposition of the conformal dielectric film 36 into the window 35, a depression is formed above the wide central window 35, which is filled by a blanket deposit and etch-back of a photoresist film PR1. This results in the type of photoresist (PR1) emitter island plug 37 that is shown in FIG. 4B.

FIG. 6A also shows the structure of FIG. 4B after forming an asymmetric PR2 etch mask 44 over the right side of plug 37 as well as the right side of the conformal, thin, dielectric film 36. Using the masks PR1 37C and the asymmetric PR2 mask 44 are used to form the asymmetric peninsula 36A' of the conformal dielectric film 36 by etching exposed portions of the conformal, thin, dielectric film 36, not protected by the PR2 asymmetric etch mask 44.

As in FIG. 4C, in FIG. 6B the conformal, thin, dielectric film 36, composed of silicon nitride or the like, has been etched anisotropically, i.e. vertically. The thick, second, upper insulation film 34 (i.e. the thick top SiO2 film) and the patterned, etch stop/insulator film 28 (i.e. the thin bottom $SiO_2$ film) both provide etch-stops, such that aside from the plug 37 the conformal, thin, dielectric film 36 (silicon nitride) is removed anisotropically to form the asymmetric peninsula 36A' on the right side of the trench (35), as shown in FIG. 6B. The underlying intrinsic base layer 32 (FIG. 3) is not disturbed by the etching because of the protection afforded by the etch stop/insulator film 28.

As shown in FIG. 5, a single N+ doped emitter region E is formed in the central portion of the surface of the intrinsic base 32 aside from asymmetric peninsula 36A'. Inner sidewall spacers 38 are provided on the sidewalls of the opening 35', as shown in FIG. 6C. The spacers 38 are formed on the top surface of the etch stop/insulator film 28. After formation of the spacers 38, a blanket layer of an extrinsic emitter (40), preferably composed of a second deposit of doped polysilicon, fills most of the central opening defined by the sidewall spacers 38 and the asymmetric peninsula 36A'.

Referring to FIGS. 5 and 6C, the extrinsic emitter (40) forms a conformal layer coating over the second insulating layer, providing a hollow space 40S' into which the lower end of the emitter contact 42E is bonded as shown in FIG. 5. In FIG. 5, a base contact 42B is shown bonded to the top surface of the base contact layer 33 on the right side thereof. Farther to the right of device 30, a collector contact 42C is shown bonded to the top surface of the collector contact region 30X which is formed between the STI regions 31B and 31C of the substrate 30S.

Other alternate structures may also be fabricated using the same method and some additional steps. FIG. 7 shows an symmetric device 30, which has a dual emitter structure with dual extrinsic emitter connectors 40E and dual intrinsic emitter regions E which is a modification of the structure of device 30 of FIG. 3.

FIGS. 8A–8H show the processing steps employed to form the device of FIG. 7.

Figure 8A:
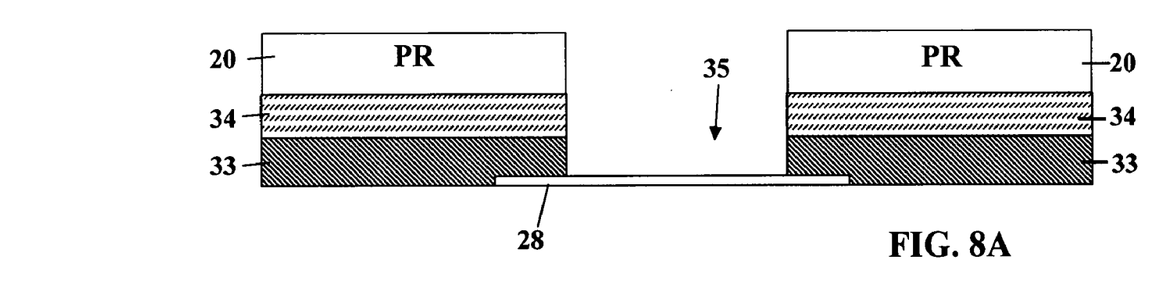
FIGS. 8A–8H show the processing steps in accordance with this invention employed to form the device of FIG. 7, including portions thereof above line 4A—4A in FIG. 7.

FIG. 8A shows the same structure as in FIG. 4A and the same processing steps are performed as described above with similar reference numbers identifying similar features.

Figure 8B:
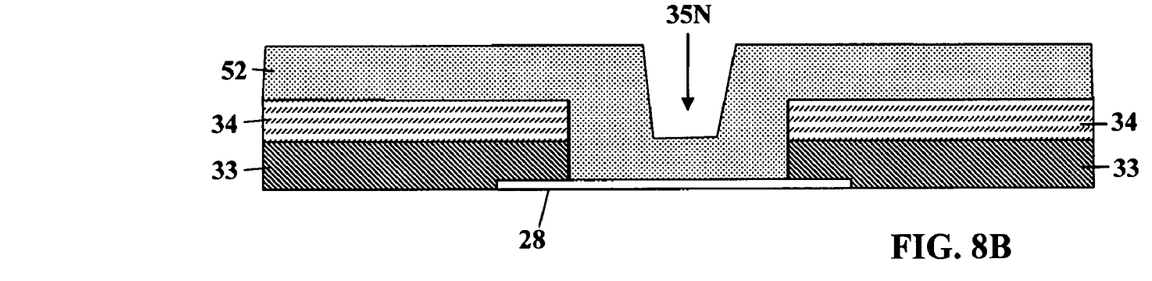

FIG. 8B shows the structure of FIG. 8A after a blanket conformal, thin spacer layer 52 of silicon nitride has been deposited. The blanket, conformal, thin spacer layer 52 covers the exposed surface of the patterned etch stop film 28 and the thick upper insulation film 34.

Figure 8C:
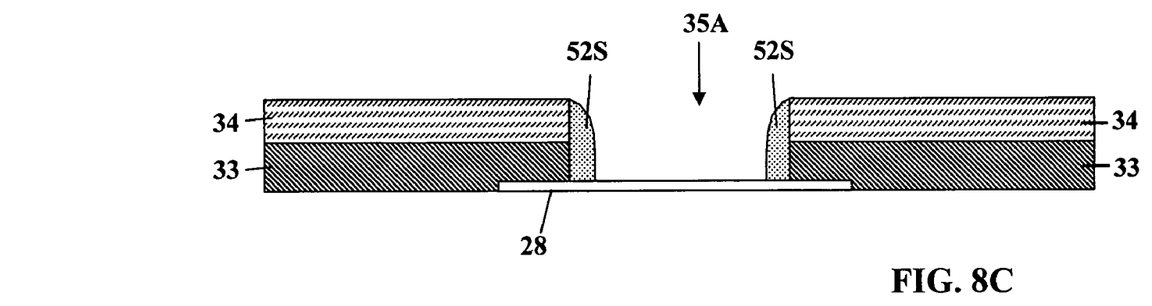

FIG. 8C shows the structure of FIG. 8B after the spacer layer 52 has been etched back to form sidewall spacers 52S on the sidewalls of the wide central window 35 (FIG. 8A) leaving a slightly narrower central window 35A therebetween reaching down to the etch stop layer 28.

Figure 8D:
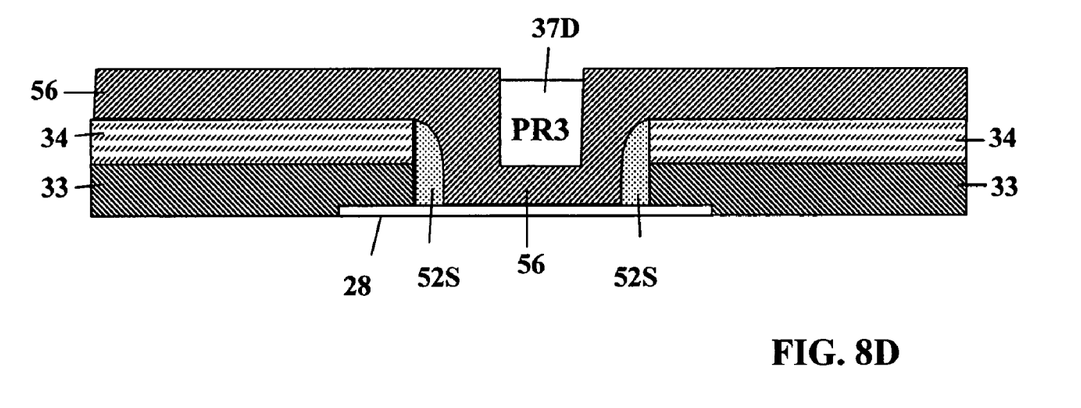

FIG. 8D shows the structure of FIG. 8C after a blanket doped or undoped conformal layer of polysilicon 56 has been deposited over the structure covering the exposed surfaces of the thick upper insulation film 34, the patterned etch stop film 28, and the sidewall spacers 52S leaving a depression above the slightly narrower, central window 35A, which is filled by a blanket deposit and etch-back of a photoresist film PR3 emitter island plug 37D as with PR1 emitter island plug 37 in FIG. 4B.

Figure 8E:
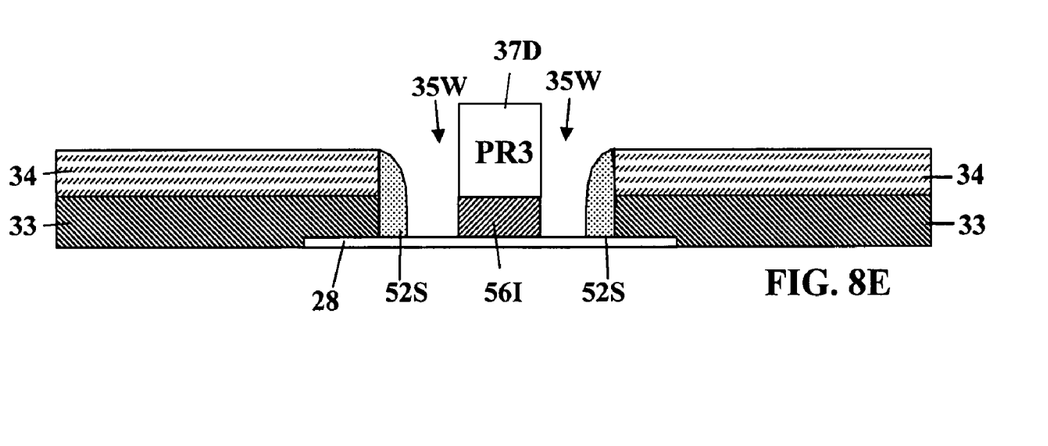

FIG. 8E shows the structure of FIG. 8D after the PR3 emitter island plug 37D has been used to pattern the etching of the conformal layer of polysilicon 56 using the PR3 emitter island plug 37D as an etch mask. In this process, the conformal layer of polysilicon 56 is etched anisotropically, i.e. vertically. The sidewalls 52S and the etch stop/insulator film 28 (i.e. the thin bottom SiO2 film) both provide etch-stops, such that aside from the plug 37D the conformal layer of polysilicon 56 is removed anisotropically to form the polysilicon island 56I as shown in FIG. 8E and the underlying intrinsic base layer 32 (FIG. 3) is not disturbed because of the protection afforded by the etch stop/insulator film 28.

The result is that window 35A of FIG. 8C has been modified into a narrow annular window or a dual set of narrow juxtaposed extrinsic emitter windows 35W.

Figure 8F:
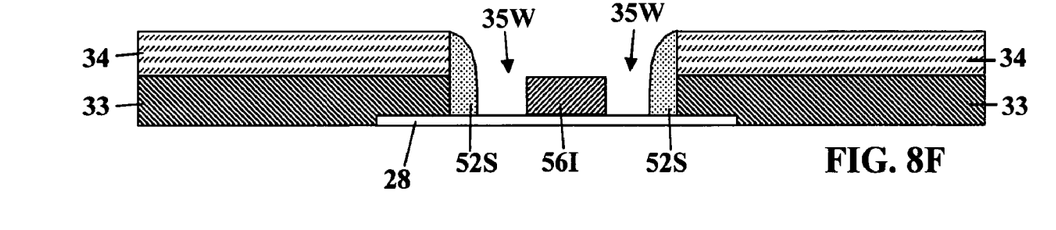

FIG. 8F shows the structure of FIG. 8E after the photoresist plug 37D has been removed.

Figure 8G:
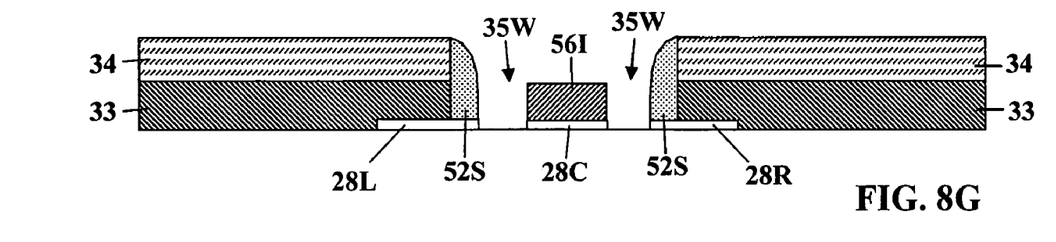

FIG. 8G shows the structure of FIG. 8F after the exposed portions of the SiO₂ etch stop/insulator film 28 at the bottom of the narrowed extrinsic emitter window(s) 35W have been removed through the narrow extrinsic emitter window(s) 35W, aside from the polysilicon island 56I.

Figure 8H:
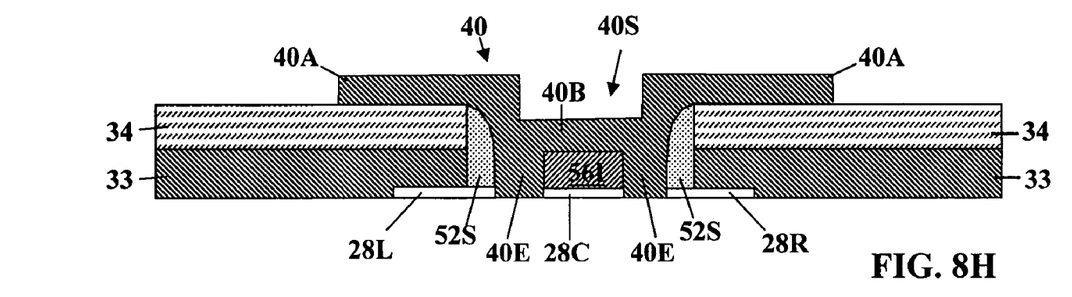

FIG. 8H shows the structure of FIG. 8G after the extrinsic emitter film (40) composed of doped polysilicon is deposited and patterned, as shown in forming the dual extrinsic emitter connectors 40E on either side of the polysilicon island 56I. This emitter polysilicon film (40) is preferred to be doped in-situ n-type (for an n-p-n transistor) or p-type (for a p-n-p transistor), so that the emitter dopant can extend evenly to the base film interface. As stated above, the extrinsic emitter (40) forms a conformal layer coating the second insulating layer 34, providing the hollow space 40S to which the lower end of an emitter contact 42E shown in FIG. 7 is bonded.

In summary, the double small emitter E will result in a net smaller emitter than can be obtained with standard lithography through standard methods and without extraordinary expense. Further, the double emitter E reduces the "pinch-in" condition as there is not a single emitter center to focus the current. With an additional mask, the double emitter E may be converted to a single narrow emitter. This will result in lower power and devices with lower thermal resistance and less self-heating.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

The invention claimed is:

1. A double-polysilicon, self-aligned bipolar transistor having a collector region formed in a doped semiconductor substrate, an intrinsic counterdoped base formed on the surface of the substrate and a doped emitter formed in the surface of the intrinsic counterdoped base, comprising:
   a first dielectric layer formed over a portion of the top surface of the intrinsic counterdoped base above the collector region in the substrate;
   a base contact layer of a conductive material formed on exposed surfaces of the first dielectric layer and the intrinsic counterdoped base aside from the first dielectric layer;
   a second dielectric layer formed over the base contact layer;
   a wide window extending through the first dielectric layer and the base contact layer stopping at the first dielectric layer;
   sidewall spacers formed on the sidewalls of the wide window;
   a narrowing structure formed in the wide window;
   at least one narrowed window formed within the wide window juxtaposed with the narrowing structure;
   the narrowed window and the remainder of the wide window being filled with doped polysilicon comprising an extrinsic emitter; and
   an intrinsic emitter region formed below the extrinsic emitter in the surface of the intrinsic counterdoped base.

2. The device of claim 1 wherein:
   the narrowing structure is a central island: and
   dual extrinsic emitters are juxtaposed with the central island between the sidewall spacers.

3. The device of claim 1 wherein:
   the narrowing structure is an island;
   the extrinsic emitter surrounds the island; and
   the extrinsic emitter fills the space between the island and the sidewall spacers.

4. The device of claim 3 wherein the island comprises a dielectric material.

5. The device of claim 3 wherein the island comprises polysilicon.

6. The device of claim 3 wherein the island comprises doped polysilicon.

7. The device of claim 1 wherein:
   the extrinsic emitter comprises a conformal coating overlying at least a portion of the second dielectric layer providing a hollow space above the wide window; and
   an emitter contact fills the hollow space in the extrinsic emitter.

8. The device of claim 1 wherein:
   dual narrowed windows are formed separated by the narrowing structure which comprises an island formed on the first dielectric layer between the dual narrowed windows; and
   dual extrinsic emitters are juxtaposed with the island.

9. A double-polyilicon self-aligned bipolar transistor having a collector region formed in a doped semiconductor substrate, an intrinsic counterdoped base formed on the surface of the substrate and a doped emitter formed in the surface of the intrinsic counterdoped base, comprising:
   a first dielectric layer composed of silicon oxide formed over the top surface of the intrinsic counterdoped base above the collector region in the substrate;
   a base contact layer composed of doped polysilicon formed over the first dielectric layer and the intrinsic counterdoved base;
   a second dielectric layer composed of silicon oxide formed over the base contact layer;
   a wide window space extending through the second dielectric layer and the base contact layer stopping at the first dielectric layer;
   sidewall spacers formed on the sidewalls of the wide window space;
   a central island comprising narrowing structure formed in the wide window on the surface of the first dielectric layer, the central island spaced from the sidewall spacers forming at least one narrowed window space within the wide window;
   an additional sidewall spacer formed on exposed sidewall surfaces of the central island leaving a remainder of the narrowed window space aside therefrom;
   an extrinsic emitter and an emitter contact composed of doped polysilicon filling the narrowed window and the remainder of the wide window space; and
   an emitter formed below the extrinsic emitter in the surface of the intrinsic counterdoped base.

10. The device of claim 9 wherein dual extrinsic emitters are juxtaposed with the central island between the sidewall spacers.

11. The device of claim 9 wherein:
the extrinsic emitter surrounds the central island, and
the emitter filling space between the central island and the sidewall spacers.

12. The device of claim 9 wherein the central island comprises a dielectric material.

13. The device of claim 9 wherein the central island comprises polysilicon.

14. The device of claim 9 wherein the central island comprises doped polysilicon.

15. The device of claim 9 wherein:
the extrinsic emitter comprises a conformal coating overlying at least a portion of the second dielectric layer providing a hollow space above the wide window, and
the emitter contact fills the hollow space in the extrinsic emitter.

16. A double-polysilicon, self-aligned bipolar transistor having a collector region formed in a doped semiconductor substrate, an intrinsic counterdoped base formed on the surface of the substrate and a doped emitter formed in the surface of the intrinsic counterdoped base, comprising:
a first dielectric layer composed of silicon oxide formed over the top surface of the intrinsic counterdoped base above the collector region in the substrate;
a base contact layer composed of doped polysilicon formed over the first dielectric layer and the intrinsic counterdoped base;
a second dielectric layer composed of silicon oxide formed over the base contact layer;
a wide window space extending through the second dielectric layer and the base contact layer stopping at the first dielectric layer;
a narrowing structure formed on a sidewall of the wide window on the surface of the first dielectric layer forming a narrowed window space within the wide window space;
a sidewall spacer formed on exposed sidewalls of the narrowed window space;
an extrinsic emitter and an emitter contact composed of doped polysilicon filling the narrowed window space; and
an emitter formed below the extrinsic emitter in the surface of the intrinsic counterdoped base.

17. The device of claim 16 wherein the narrowing structure comprises a dielectric material.

18. The device of claim 16 wherein the narrowing structure comprises polysilicon.

19. The device of claim 16 wherein the narrowing structure comprises doped polysilicon.

20. The devke of claim 16 wherein:
the extrinsic emitter comprises a conformal coating overlying at least a portion of the second dielectric layer providing a hollow space above the wide window, and
the emitter contact fills the hollow space in the extrinsic emitter.

* * * * *

UNITED STATES PATENT AND TRADEMARK OFFICE
CERTIFICATE OF CORRECTION

PATENT NO. : 7,180,157 B2  Page 1 of 1
APPLICATION NO. : 10/978775
DATED : February 20, 2007
INVENTOR(S) : Gregory G. Freeman et al.

It is certified that error appears in the above-identified patent and that said Letters Patent is hereby corrected as shown below:

Col. 1, Line 7, should read

--Notice of Government Rights
This invention was made with Government support under N6601-02-C-8014 awarded by DARPA.
The Government has certain rights in this invention.--

Signed and Sealed this

Eleventh Day of September, 2012

David J. Kappos
*Director of the United States Patent and Trademark Office*